(12) United States Patent
Sha (10) Patent No.: US 12,550,306 B2
(45) Date of Patent: Feb. 10, 2026

(54) SEPARATION POSITIONING MECHANISM AND ROBOT POSITIONING SYSTEM

(71) Applicant: Siemens Aktiengesellschaft, Munich (DE)

(72) Inventor: Yaoyao Sha, Nanjing (CN)

(73) Assignee: Siemens Aktiengesellschaft, Munich (DE)

( * ) Notice: Subject to any disclaimer, the term of this patent is extended or adjusted under 35 U.S.C. 154(b) by 1263 days.

(21) Appl. No.: 17/270,521

(22) PCT Filed: Aug. 21, 2019

(86) PCT No.: PCT/CN2019/101861
§ 371 (c)(1),
(2) Date: Feb. 23, 2021

(87) PCT Pub. No.: WO2020/038419
PCT Pub. Date: Feb. 27, 2020

(65) Prior Publication Data
US 2021/0316420 A1 Oct. 14, 2021

(30) Foreign Application Priority Data
Aug. 23, 2018 (CN) .................. 201821372715.X (51) Int. Cl.
*B23P 19/00* (2006.01)
*B25J 15/02* (2006.01)
(Continued)

(52) U.S. Cl.
CPC ...... *H05K 13/0069* (2013.01); *B25J 15/0253* (2013.01); *B25J 15/08* (2013.01)

(58) Field of Classification Search
CPC .... B25J 15/0057; B25J 15/0253; B25J 15/08; H05K 13/0061; H05K 13/0069; B25B 11/00
See application file for complete search history.

(56) References Cited

U.S. PATENT DOCUMENTS 4,355,446 A * 10/1982 Shimajiri ........... B23Q 3/15534
409/80
4,369,563 A * 1/1983 Williamson ......... B23Q 7/1426
700/112
(Continued)

FOREIGN PATENT DOCUMENTS

| CN | 105643650 A | 6/2016 |
|---|---|---|
| CN | 107127542 A | 9/2017 |

(Continued)

OTHER PUBLICATIONS

International Search Report for International Application No. PCT/CN2019/101861 dated Nov. 13, 2019.
(Continued)

*Primary Examiner* — Paul D Kim
(74) *Attorney, Agent, or Firm* — Harness, Dickey & Pierce, P.L.C.

(57) ABSTRACT

A separation positioning mechanism and a robot positioning system are disclosed. An embodiment of the separation positioning mechanism includes a fixed part, at least one guide rod, a movable part, a power part, and a positioning member. One end of the guide rod is fixed to the fixed part; the movable part is provided on the guide rod; the movable part is slidable along the guide rod to push a first assembly member placed on a transmission mechanism to be separated from the transmission mechanism. The robot positioning system includes the separation positioning mechanism.

15 Claims, 8 Drawing Sheets

(51) Int. Cl.
*B25J 15/08* (2006.01)
*H05K 13/00* (2006.01)

(56) References Cited

U.S. PATENT DOCUMENTS

| | | |
|---|---|---|
| 4,655,676 A | 4/1987 | Aktiebolag |
| 4,820,113 A * | 4/1989 | Farquhar .............. H05K 13/046 |
| | | 414/736 |

FOREIGN PATENT DOCUMENTS

| | | | |
|---|---|---|---|
| CN | 107470891 A | | 12/2017 |
| CN | 107738065 A | | 2/2018 |
| CN | 208556566 U | | 3/2019 |
| CN | 209239402 U | | 8/2019 |
| CN | 212760940 U | * | 3/2021 |

OTHER PUBLICATIONS

Written Opinion for International Application No. PCT/CN2019/101861 dated Nov. 13, 2019.

* cited by examiner

SEPARATION POSITIONING MECHANISM AND ROBOT POSITIONING SYSTEM

PRIORITY STATEMENT

This application is the national phase under 35 U.S.C. § 371 of PCT International Application No. PCT/CN2019/101861 which has an International filing date of Aug. 21, 2019, which designated the United States of America and which claims priority to Chinese patent application number CN 201821372715. X filed Aug. 23, 2018, the entire contents of each of which are hereby incorporated herein by reference.

FIELD

Embodiments of the invention generally relate to the field of automated production design, in particular to a separating/positioning mechanism and a robot positioning system.

BACKGROUND

In modern production processes, due to the ever rising cost of manual labour, a lot of repetitive production work is gradually being replaced by automated equipment. Conventional automated equipment (e.g. non-standard plug-in machines) can perform flow-type production quickly and reduce manual labour costs effectively, but are not very versatile due to mechanical structure limitations and control system complexity. For this reason, robots have begun to replace conventional automated equipment. For example, palletizing robots and bag-stacking robots, etc. are used for material stacking, etc.

As technology advances, in order to better meet the assembly requirements of different products and enhance the flexibility of automated equipment, robots have begun to be used in real production for fitting together assembly members. In order to fit assembly members together, robots generally need to have a positioning function; although the palletizing robots, etc. mentioned above also need to perform positioning, they are not required to have high positioning precision. Thus, in certain assembly scenarios requiring precise positioning, e.g. the assembly of circuit board components, etc., existing positioning methods are not very suitable, because the robot will be affected by vibration of moving components in the system, ultimately resulting in the robot being unable to perform high-precision assembly.

SUMMARY

Embodiments of the present application provide a separating/positioning mechanism and a robot positioning system, which improve upon or even solve the technical problem in the prior art of a robot being unable to perform high-precision assembly due to being subjected to vibration of moving components in a system.

In an embodiment, the present application provides a separating/positioning mechanism, comprising a fixed part, at least one guide rod, a movable part, a power part and a positioning member. One end of the at least one guide rod is fixed to the fixed part; the movable part is arranged on the at least one guide rod, the movable part being capable of sliding along the at least one guide rod so as to push a first assembly member placed on a conveying mechanism to separate from the conveying mechanism. The power part drives the movable part to slide along the at least one guide rod. The positioning member is arranged on the movable part, the positioning member being adapted to position the first assembly member that has separated from the conveying mechanism.

In another embodiment, the present application also provides a robot positioning system, the robot positioning system comprising the separating/positioning mechanism, a positioning part and a robot; at least one second assembly member can be placed on the positioning part; the robot is adapted to grab the at least one second assembly member from the positioning part, and fit the grabbed second assembly member onto the first assembly member secured by the separating/positioning mechanism.

BRIEF DESCRIPTION OF THE DRAWINGS

Preferred embodiments of the present application are described in detail below by referring to the drawings, to give those skilled in the art a clearer understanding of the abovementioned and other features and advantages of the present application. In the drawings.

KEY TO REFERENCE LABELS

| Label | Meaning |
|---|---|
| 1 | Positioning part |
| 11 | Positioning plate |
| 12 | Positioning slot |
| 2 | First assembly member |
| 21 | Positioning hole |
| 3 | Conveying mechanism |
| 4 | Second assembly member |
| 5 | Separating/positioning mechanism |
| 51 | Fixed part |
| 52 | Guide rod |
| 53 | Movable part |
| 54 | Power part |
| 55 | Positioning member |
| 551 | Positioning pin |
| 552 | First limiting structure |
| 6 | Robot |
| 61 | End execution mechanism |
| 611 | Connection part |
| 612 | Grabbing mechanism |
| 613 | Axis |
| 614 | Pneumatic gripper |
| 615 | Jaw |
| 616 | Second limiting structure |
| 7 | Fixing frame |
| 71 | Connecting arm |

DETAILED DESCRIPTION OF THE EXAMPLE EMBODIMENTS

In an embodiment, the present application provides a separating/positioning mechanism, comprising a fixed part, at least one guide rod, a movable part, a power part and a positioning member. One end of the at least one guide rod is fixed to the fixed part; the movable part is arranged on the at least one guide rod, the movable part being capable of sliding along the at least one guide rod so as to push a first assembly member placed on a conveying mechanism to separate from the conveying mechanism. The power part drives the movable part to slide along the at least one guide rod. The positioning member is arranged on the movable part, the positioning member being adapted to position the first assembly member that has separated from the conveying mechanism.

As can be seen, this embodiment provides a particular structure of the separating/positioning mechanism; the separating/positioning mechanism can separate the first assembly member from the conveying mechanism, so that vibration of the conveying mechanism no longer affects the spatial position of the first assembly member. At the same time, the first assembly member is positioned so as to achieve high-precision assembly.

In another embodiment, the positioning member comprises multiple positioning pins, the multiple positioning pins having one end fixed to the movable part, and the other ends of the multiple positioning pins being insertion-connected to correspondingly arranged positioning holes in the first assembly member to position the first assembly member. The multiple positioning pins are provided with a first limiting structure, an end face thereof abutting the insertion-connected first assembly member to limit the first assembly member.

This embodiment provides a particular structure of the positioning member. The positioning pins mate with the positioning holes to position the first assembly member. The precision and uniformity of an initial spatial position of the first assembly member are guaranteed by means of the positioning member.

In another embodiment, the present application also provides a robot positioning system, the robot positioning system comprising the separating/positioning mechanism, a positioning part and a robot; at least one second assembly member can be placed on the positioning part; the robot is adapted to grab the at least one second assembly member from the positioning part, and fit the grabbed second assembly member onto the first assembly member secured by the separating/positioning mechanism.

This embodiment provides a robot positioning system that uses the separating/positioning mechanism. The robot positioning system separately positions the first assembly member and the second assembly member. The precision and uniformity of spatial position of the second assembly member are guaranteed.

In another embodiment, the positioning part comprises at least one positioning plate, each said positioning plate being provided with a positioning slot corresponding to an outer contour of the at least one second assembly member. This embodiment provides a positioning plate positioning structure, i.e. the positioning slot. Precision requirements for positioning of the second assembly member can be met.

In another embodiment, the robot positioning system further comprises a fixing frame on which the positioning part and the separating/positioning mechanism are securely mounted. This embodiment provides the structure of the fixing frame, in order to establish a physical connection between the positioning part and the separating/positioning mechanism, to guarantee the spatial positional relationship therebetween.

In another embodiment, the robot positioning system further comprises a connecting arm, having one end fixed to the fixing frame and another end fixed to the robot. This embodiment provides one said connecting arm, the two ends thereof being physically connected in a rigid manner to the robot and the fixing frame respectively, guaranteeing the spatial positional relationship therebetween.

In another embodiment, the robot has an end execution mechanism, the end execution mechanism comprising a connection part and multiple grabbing mechanisms; the connection part is connected to the robot, and rotates along an axis. The multiple grabbing mechanisms are arranged on the connection part along a peripheral circle of the axis, and are driven by the connection part to rotate along the axis so as to allow each said grabbing mechanism to independently grab the second assembly member. This embodiment provides one type of the end execution mechanism, considerably increasing the assembly efficiency of the robot.

In another embodiment, the grabbing mechanism comprises a pneumatic gripper and two jaws; one end of the pneumatic gripper is fixed to the connection part, and the other end is provided with two gripper fingers capable of sliding toward or away from each other in one degree of freedom. The two jaws are fixed to the pair of gripper fingers respectively, and the two jaws are driven by the two gripper fingers respectively to slide toward or away from each other in the degree of freedom so as to grab the second assembly member. This embodiment provides a particular structure of the grabbing mechanism. The grabbing mechanism is used for grabbing and fitting the first assembly member.

In another embodiment, the jaw is provided with a second limiting structure, an end face thereof abutting the grabbed second assembly member to limit the second assembly member, the end face of the second limiting structure being perpendicular to the assembly direction of the second assembly member. This embodiment provides one type of the second limiting structure; this structure can effectively prevent the second assembly member from sliding on the grabbing mechanism, to guarantee the accuracy of spatial position of the second assembly member during assembly.

The applicant has found that there has been a sharp increase in production methods in which manual labour is used for equipment assembly due to the ever rising cost of manpower in society. Furthermore, the proficiency and mobility of assembly personnel will both have an effect on equipment output and stability. Automated production is distinguished by such features as high speed and good stability. Automated production assembly has numerous advantages, but if non-standard equipment is used for automated production, versatility will be low due to the fact that each type of non-standard equipment is only developed for specific equipment, and non-standard equipment might not be able to meet production requirements after a product update. A robot can change an end execution mechanism thereof and an assembly path of the end execution mechanism according to different products in order to assembly different products, so has good versatility and high efficiency. However, at the present stage, robots are mainly used in fields such as palletizing, bag-stacking and welding. None of these robot application scenarios require high precision. In scenarios requiring relatively high precision, e.g. circuit board assembly, error precision for assembly members is generally controlled at 0.2-0.3 mm. Although the assembly precision of the robot itself can meet the requirements, assembly members are conveyed by means of a conveying mechanism on a production line, and the positioning precision of assembly members cannot be guaranteed before they are grabbed by the robot. This is mainly because production line vibration will affect robot precision when grabbing, and will also affect subsequent robot assembly. To solve the abovementioned problem, the present application provides a robot positioning system, which positions assembly members to guarantee accurate positions of assembly members in space. In addition, the system needs to eliminate the effect of conveying mechanism vibration on assembly members, so as to achieve high-precision assembly of assembly members using a robot.

To furnish a clearer understanding of the technical features, object and effects of the present application, particular embodiments of the present application are now described with reference to the drawings, in which identical labels indicate identical parts. In the drawings showing the embodiments, if the last two digits are the same, this indicates structurally identical or structurally similar but functionally identical components.

In order that the drawings appear uncluttered, only parts relevant to embodiments of the present application are shown schematically in each drawing, but these do not represent the actual structure thereof as a product. Furthermore, in order that the drawings appear uncluttered for ease of understanding, in the case of components having the same structure or function in certain drawings, only one of these is shown schematically or only one of these is labelled.

Figure 1:
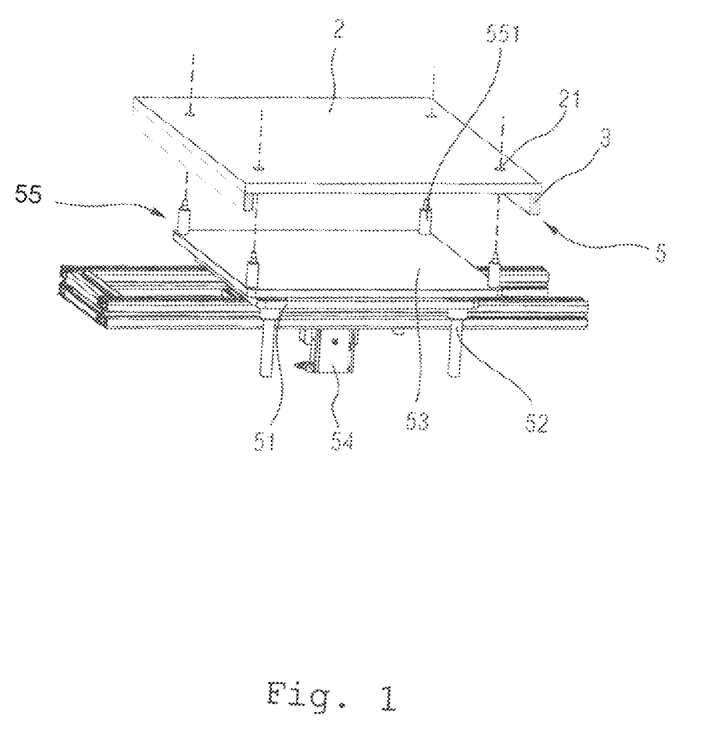
FIG. 1 is a structural schematic drawing of the separating/positioning mechanism of an embodiment.

FIG. 1 is a structural schematic drawing of the separating/positioning mechanism of an embodiment of the present application. As shown in FIG. 1, the present application provides a separating/positioning mechanism 5, comprising a fixed part 51, at least one guide rod 52, a movable part 53, a power part 54 and a positioning member 55. One end of the guide rod 52 is fixed to the fixed part 51. The movable part 53 is arranged on the guide rod 52, and the movable part 53 can slide along the guide rod 52, so as to push a first assembly member 2 placed on a conveying mechanism 3 to separate from the conveying mechanism 3. The power part 54 drives the movable part 53 to slide along the guide rod 52; the positioning member 55 is arranged on the movable part 53, and the positioning member 55 is adapted to position the first assembly member 2 that has separated from the conveying mechanism 3.

In this embodiment, a particular structure of the separating/positioning mechanism 5 is provided. The movable part 53 slides along the guide rod 52 and is driven by means of the power part 54; the power part 54 employs a pneumatic system. There are four guide rods 52 arranged at four opposite corners of the fixed part 51, in order to make the sliding of the movable part 53 more steady. The sliding of the movable part 53 can push the first assembly member 2 to separate from the conveying mechanism 3, in order that the first assembly member 2 is no longer affected by vibration of the conveying mechanism 3. The positioning member 55 is responsible for positioning the first assembly member 2 that has separated from the conveying mechanism 3; at this time, the fact that the first assembly member 2 is in a relatively stationary state makes it easier for a robot 6 to grab the first assembly member 2 accurately and perform high-precision assembly.

Figure 2:
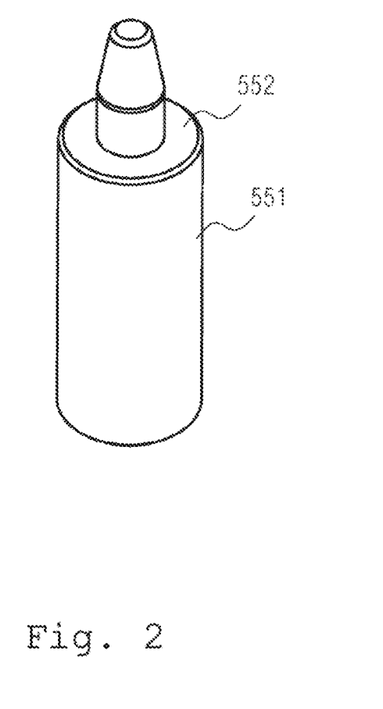
FIG. 2 is a structural schematic drawing of the positioning pin of an embodiment.

FIG. 2 is a structural schematic drawing of the positioning pin of an embodiment of the present application. As shown in FIGS. 1 and 2, in another optional embodiment, the positioning member 55 comprises multiple positioning pins 551; the multiple positioning pins 551 have one end fixed to the movable part 53, the other ends of the multiple positioning pins 551 being insertion-connected to correspondingly arranged positioning holes 21 in the first assembly member 2, to position the first assembly member 2. The multiple positioning pins 551 are provided with a first limiting structure 552; an end face of the first limiting structure 552 abuts the insertion-connected first assembly member 2, to limit the first assembly member 2.

This embodiment provides a positioning method and particular structure of the positioning pin 551. The length direction of the positioning pin 551 is the same as the sliding direction of the movable part 53. When the movable part 53 is pushed, the positioning pin 551 also slides with it in the sliding direction of the movable part 53, and positioning after insertion-connection of the positioning pin 551 and positioning hole 21 is thereby achieved. It must be pointed out that at this time, the first assembly member 2 can still slide in the length direction of the positioning pin 551, and the first limiting structure 552 can limit the sliding of the first assembly member 2 in one direction (i.e. the direction of gravity), to prevent the first assembly member 2 from continuing to slide downward. Specifically, in a circuit board assembly scenario as shown in FIGS. 1 and 2, the first assembly member 2 is equivalent to a circuit board in the figure, and four corners of the circuit board are provided with corresponding positioning holes 21. There are four positioning pins 551, arranged at four opposite corners of the movable part 53 respectively, and each positioning pin 551 is provided with a first limiting structure 552 at the same height. After insertion-connection of the positioning holes 21 of the circuit board and the positioning pins 551, the circuit board will continue to slide in the length direction of the positioning pins 551 and is limited by the first limiting structures 552. The first limiting structure 552 is a step structure on the positioning pin 551 and abuts the circuit board. The movable part 53 is fixed to the positioning pins 551, the power part 54 drives the movable part 53 to slide, and the movable part 53 is fixed to the positioning pins 551; thus, ultimately, the circuit board in abutment with the first limiting structures 552 will also be driven by the power part 54, and the circuit board is pushed off the conveying mechanism 3.

Figure 3:
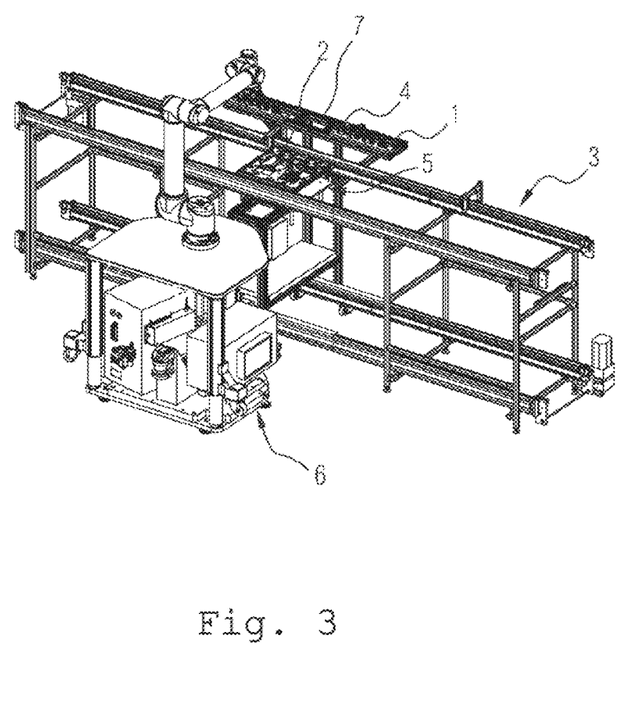
FIG. 3 is a schematic drawing of the overall structure of an embodiment of the robot positioning system of an embodiment.
Figure 4:
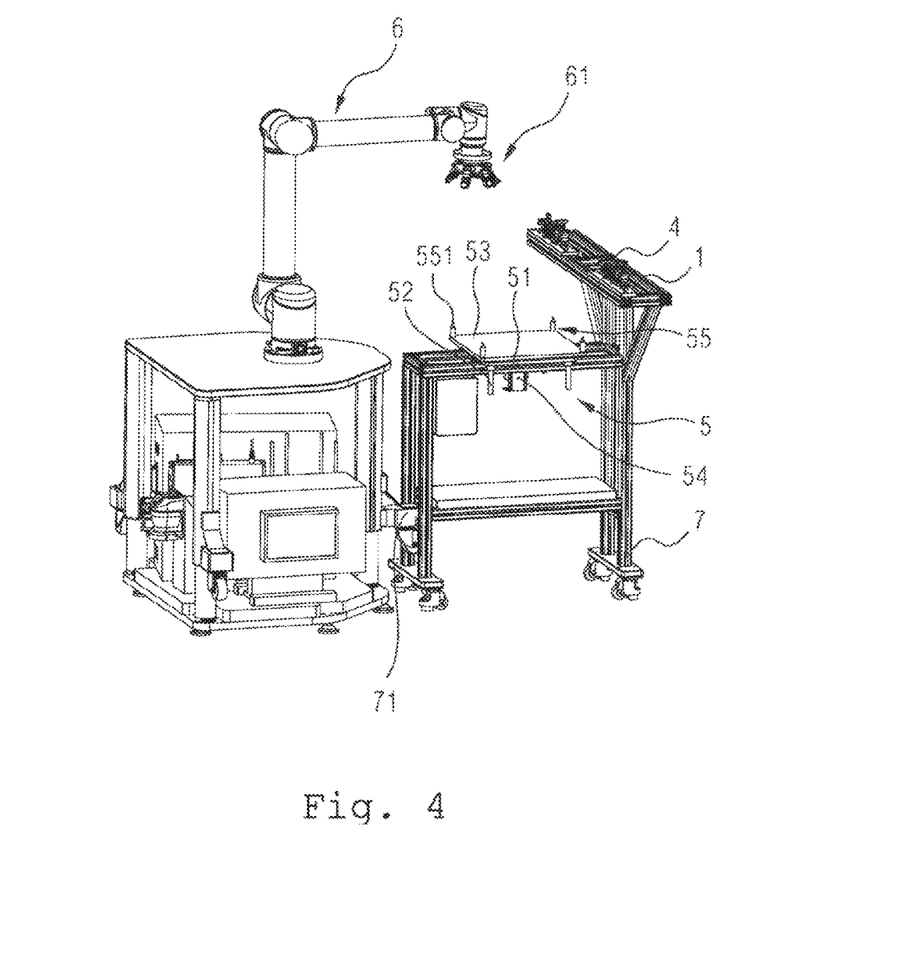
FIG. 4 is a structural schematic drawing of another embodiment of the robot positioning system of an embodiment.

FIG. 3 is a schematic drawing of the overall structure of an embodiment of the robot positioning system of an embodiment of the present application. FIG. 4 is a structural schematic drawing of another embodiment of the robot positioning system of an embodiment of the present application. As shown in FIGS. 3 and 4, in another optional embodiment, the present application also provides a robot positioning system, comprising a separating/positioning mechanism 5, a positioning part 1 and a robot 6; at least one second assembly member 4 can be placed on the positioning part 1. The robot 6 is adapted to grab at least one second assembly member 4 from the positioning part 1, and fit the grabbed second assembly member 4 onto the first assembly member 2 secured by the separating/positioning mechanism 5.

A robot positioning system is disclosed in this embodiment. The positioning part 1 is configured to precisely position the second assembly member 4, and the positioned second assembly member 4 can be precisely grabbed by means of the robot 6. The separating/positioning mechanism 5 is configured to separate the first assembly member 2 from the conveying mechanism 3, thus eliminating vibration caused to the first assembly member 2 by the conveying mechanism 3 due to conveying. In addition, the separation from the conveying mechanism 3 subjects the first assembly member 2 to precise positioning. The movement path precision of the robot 6 can be kept within a permitted range, and when the second assembly member 4 and first assembly member 2 are at a relatively stable and precise position in the same space, the assembly members can finally be fitted together with high precision.

Figure 5:
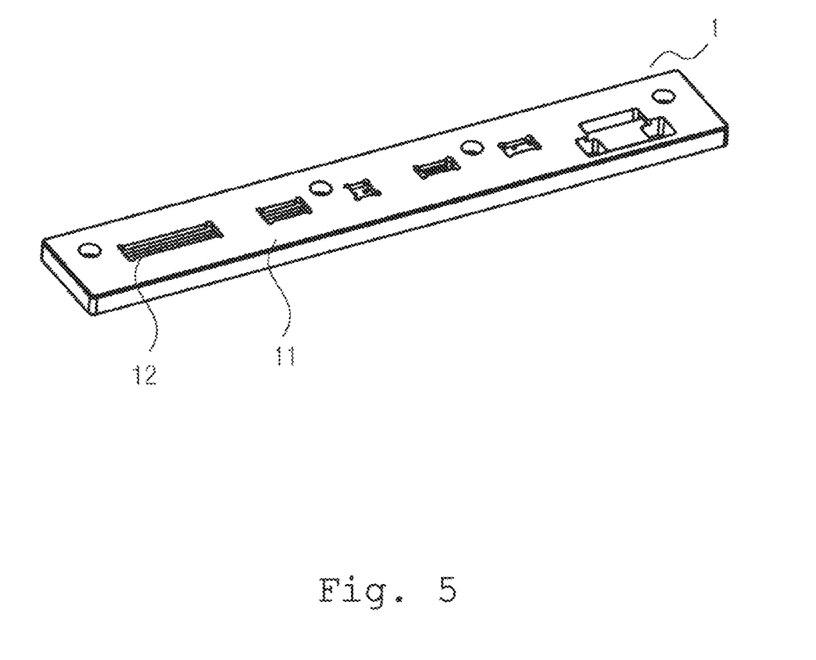
FIG. 5 is a structural schematic drawing of the positioning plate of an embodiment.

FIG. 5 is a structural schematic drawing of the positioning plate of an embodiment of the present application. As shown in FIG. 5, in another optional embodiment, the positioning part 1 comprises at least one positioning plate 11; each positioning plate 11 is provided with a positioning slot 12 corresponding to an outer contour of the second assembly member 4. This embodiment discloses a particular positioning structure of the positioning part 1; it must be pointed out that in order to increase production efficiency, multiple positioning plates 11 are provided, and each positioning plate 11 will be correspondingly provided with multiple positioning slots 12. The positioning slots 12 position each second assembly member 4 by means of the outer contour of the second assembly member 4.

As shown in FIGS. 3 and 4, in another optional embodiment, the robot positioning system further comprises a fixing frame 7; the positioning part 1 and the separating/positioning mechanism 5 are securely mounted on the fixing frame 7. This embodiment provides a particular manner of implementation for fixing the positioning part 1 and the separating/positioning mechanism 5. In order to better establish a more precise positional relationship between the positioning part 1 and the separating/positioning mechanism 5, the fixing frame 7 is used to physically connect the positioning part 1 and the separating/positioning mechanism 5 in a rigid fashion.

As shown in FIGS. 3 and 4, in another optional embodiment, the robot positioning system further comprises a connecting arm 71, having one end fixed to the fixing frame 7 and another end fixed to the robot 6. This embodiment provides a manner of implementation for fixing the robot 6. This embodiment establishes a rigid physical connection between the robot 6 on the one hand and the positioning part 1 and separating/positioning mechanism 5 on the other, thereby making the positional relationship of the three more precise.

Figure 6:
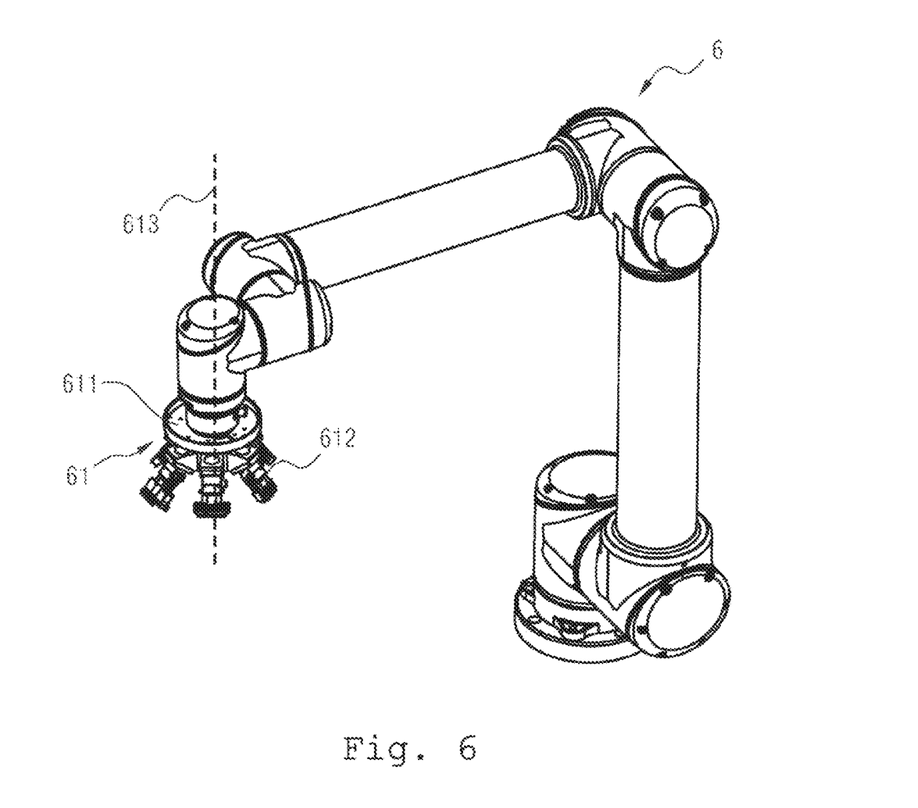
FIG. 6 is a structural schematic drawing of the robot of an embodiment.

FIG. 6 is a structural schematic drawing of the robot of an embodiment of the present application. As shown in FIG. 6, in another optional embodiment, the robot 6 has an end execution mechanism 61, the end execution mechanism 61 comprising a connection part 611 and multiple grabbing mechanisms 612; the connection part 611 is connected to the robot 6, and the connection part 611 rotates along an axis 613. The multiple grabbing mechanisms 612 are arranged on the connection part 611 along a peripheral circle of the axis 613, and are driven by the connection part 611 to rotate along the axis 613; each grabbing mechanism 612 can independently grab a second assembly member 4 for assembly. This embodiment provides a particular structure of the end execution mechanism 61; multiple second assembly members 4 can be grabbed and fitted at the same time by means of the end execution mechanism 61, considerably increasing production efficiency. However, this must be based on precise positioning of the second assembly member 4 and first assembly member 2.

Figure 7:
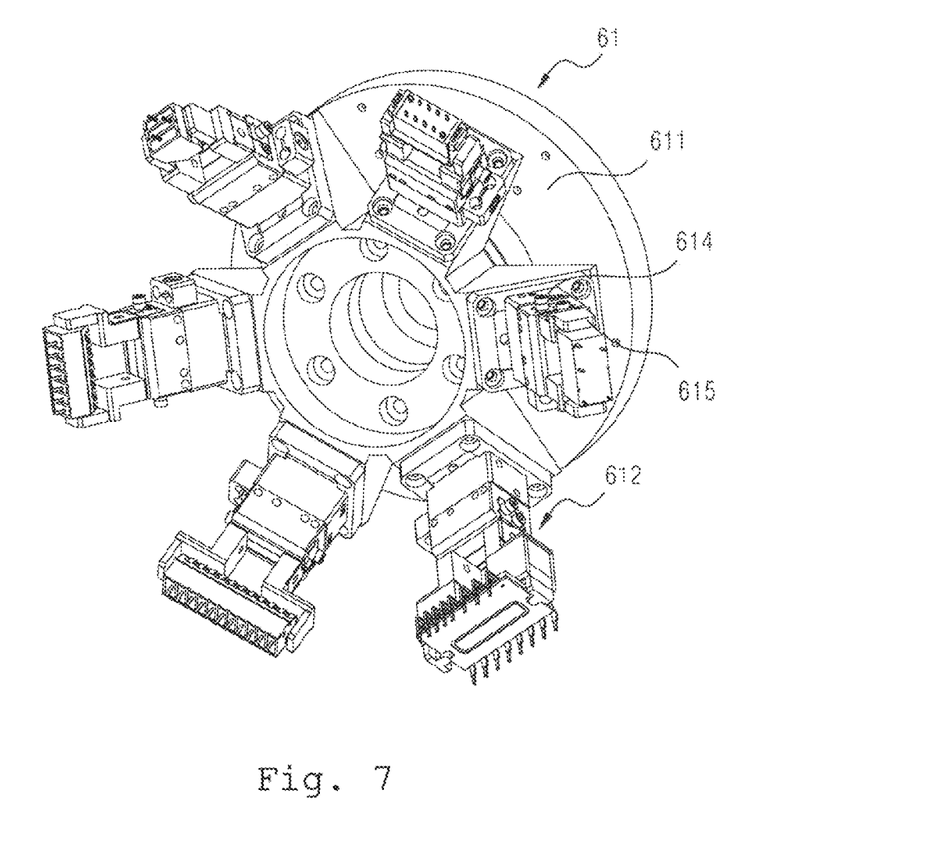
FIG. 7 is a structural schematic drawing of the grabbing mechanism of an embodiment.

FIG. 7 is a structural schematic drawing of the grabbing mechanism of an embodiment of the present application. As shown in FIG. 7, in another optional embodiment, the grabbing mechanism 612 comprises a pneumatic gripper 614 and two jaws 615; one end of the pneumatic gripper 614 is fixed to the connection part 611, and the other end is provided with two gripper fingers 615 capable of sliding toward or away from each other in one degree of freedom. The two jaws 615 are fixed to the pair of gripper fingers respectively, and the two jaws 615 are driven by the two gripper fingers respectively to slide toward or away from each other in the degree of freedom, so as to grab the second assembly member 4. This embodiment provides a particular structure of the grabbing mechanism 612, for grabbing the second assembly member 4 and fitting same onto the first assembly member 2.

Figure 8:
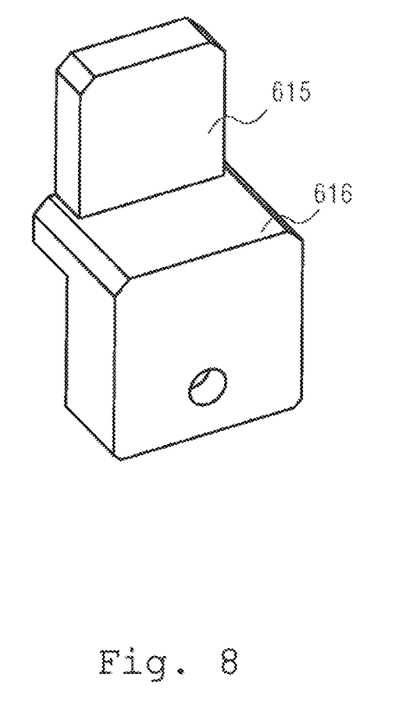
FIG. 8 is a structural schematic drawing of the jaw of an embodiment.

FIG. 8 is a structural schematic drawing of the jaw of an embodiment of the present application. As shown in FIG. 8, in another optional embodiment, the jaw 615 is provided with a second limiting structure 616; an end face of the second limiting structure 616 abuts the grabbed second assembly member 4 to limit the second assembly member 4, the end face of the second limiting structure 616 being perpendicular to the assembly direction of the second assembly member 4. This embodiment provides a particular structure of the jaw 615, and it must be specifically pointed out that the structure of the jaw 615 restricts sliding during fitting of the second assembly member 4, by means of the second limiting structure 616, such that positioning is more precise.

The present application specifically has the following beneficial effects:

The present application enables the second assembly member 4, the first assembly member 2 and a body of the robot 6 to be in a state of having relatively stable spatial positions, through the positioning of the second assembly member 4 by the positioning part 1 and the positioning of the first assembly member 2 after being separated from the conveying mechanism 3 by the separating/positioning mechanism 5. This solves the technical problem in the prior art of the robot 6 being unable to perform high-precision assembly due to being affected by vibration of moving components in the system.

The present application also discloses a particular structure of the separating/positioning mechanism 5, and a particular structure of the positioning pin 551 in the separating/positioning mechanism 5. The separating/positioning mechanism 5 achieves the objective of separating the first assembly member 2 from the conveying mechanism 3 and precisely positioning the first assembly member 2.

The present application also provides a particular structure of the positioning plate 11 in the positioning part 1; in addition, the present application further discloses the positioning slot 12 structure of the positioning plate 11 for positioning the second assembly member 4.

The present application provides the fixing frame 7 and connecting arm 71 for establishing a more stable and accurate positional relationship among the first assembly member 2, the second assembly member 4 and the robot 6.

The present application further provides a particular structure of the end execution mechanism 61, which considerably increases production efficiency under the condition that the assembly members are precisely positioned. The second limiting structure 616 further limits the grabbed second assembly member 4, guaranteeing a precise position of the second assembly member 4 when grabbed.

As used therein, "schematic" means "serving as an instance, example or illustration", and no drawing or embodiment described herein as "schematic" should be interpreted as being a more preferred or more advantageous technical solution.

It should be understood that although the description herein is based on various embodiments, it is by no means the case that each embodiment contains just one independent technical solution. Such a method of presentation is adopted herein purely for the sake of clarity. Those skilled in the art should consider the description in its entirety. The technical solutions in the various embodiments could also be suitably combined to form other embodiments capable of being understood by those skilled in the art.

The series of detailed explanations set out above are merely particular explanations of feasible embodiments of the present application, which are not intended to limit the scope of protection thereof. All equivalent embodiments or changes made without departing from the artistic spirit of the present application shall be included in the scope of protection thereof.

The invention claimed is:

1. A robot positioning system, comprising:
   a separating/positioning mechanism including
      a fixed part,
      at least one guide rod, one end of the at least one guide rod being fixed to a movable part, the at least one guide rod configured to stabilize the movable part,
      the movable part arranged on the at least one guide rod, the movable part configured to push a first assembly member, placed on a conveying mechanism, to separate from the conveying mechanism,
      a power part, configured to drive the movable part to separate from the conveying mechanism, and
      a positioning member, arranged on the movable part, the positioning member being adapted to position the first assembly member after separation from the conveying mechanism; and
   a positioning part, wherein at least one second assembly member is configured to be placed upon the positioning part, the positioning part including at least one positioning plate, each positioning plate of the at least one positioning plate including a positioning slot respectively corresponding to an outer contour of the at least one second assembly member.

2. The robot positioning system of claim 1, wherein the positioning member comprises:
   multiple positioning pins, the multiple positioning pins including one end fixed to the movable part, and other ends of the multiple positioning pins being insertion-connected to correspondingly arranged positioning holes in the first assembly member, to position the first assembly member,
   wherein the multiple positioning pins include
      a first limiting structure, an end face of the first limiting structure abutting the insertion-connected first assembly member, to limit the first assembly member.

3. The robot positioning system of claim 2, further comprising:
   a robot, adapted to grab the at least one second assembly member from the positioning part, and adapted to fit the at least one grabbed second assembly member onto the first assembly member secured by the separating/positioning mechanism.

4. The robot positioning system of claim 3, wherein the robot positioning system further comprises:
   a fixing frame, the positioning part and the separating/positioning mechanism being securely mounted to the fixing frame.

5. The robot positioning system of claim 4, further comprising:
   a connecting arm, one end of the connecting arm being fixed to the fixing frame and another end of the connecting arm being fixed to the robot.

6. The robot positioning system of claim 3, wherein the robot includes:
   an end execution mechanism, the end execution mechanism comprising:
      a connection part connected to the robot, the connection part being configured to rotate along an axis; and
      multiple grabbing mechanisms, each grabbing mechanism of the multiple grabbing mechanisms being arranged on the connection part along a peripheral circle of the axis, and drivable by the connection part to rotate along the axis to allow each grabbing mechanism of the multiple grabbing mechanisms to independently grab the at least one second assembly member.

7. The robot positioning system of claim 6, wherein a grabbing mechanism of the multiple grabbing mechanisms comprises:
   a pneumatic gripper, one end of the pneumatic gripper being fixed to the connection part and another end of the pneumatic gripper being provided with two gripper fingers configured to slide toward or away from each other in one degree of freedom; and
   two jaws, each of the two jaws being respectively fixed to the two gripper fingers, and the two jaws being respectively drivable by the two gripper fingers to slide toward or away from each other in the degree of freedom so as to grab the at least one second assembly member.

8. The robot positioning system of claim 7, wherein each of the two jaws includes:
   a second limiting structure, an end face of the second limiting structure being configured to abut the at least one grabbed second assembly member to limit the second assembly member, the end face of the second limiting structure being perpendicular to an assembly direction of the at least one second assembly member.

9. The robot positioning system of claim 1, further comprising:
   a robot, adapted to grab the at least one second assembly member from the positioning part, and adapted to fit the grabbed at least one second assembly member onto the first assembly member secured by the separating/positioning mechanism.

10. The robot positioning system of claim 9, wherein the robot positioning system further comprises:
    a fixing frame, the positioning part and the separating/positioning mechanism being securely mounted to the fixing frame.

11. The robot positioning system of claim 10, further comprising:
    a connecting arm, one end of the connecting arm being fixed to the fixing frame and another end of the connecting arm being fixed to the robot.

12. The robot positioning system of claim 9, wherein the robot includes:
    an end execution mechanism, the end execution mechanism comprising:
       a connection part connected to the robot, the connection part being configured to rotate along an axis; and
       multiple grabbing mechanisms, each grabbing mechanism of the multiple grabbing mechanisms being arranged on the connection part along a peripheral circle of the axis, and drivable by the connection part to rotate along the axis to allow each grabbing mechanism of the multiple grabbing mechanisms to independently grab the at least one second assembly member.

13. The robot positioning system of claim 12, wherein a grabbing mechanism of the multiple grabbing mechanisms comprises:
   a pneumatic gripper, one end of the pneumatic gripper being fixed to the connection part and another end of the pneumatic gripper being provided with two gripper fingers configured to slide toward or away from each other in one degree of freedom; and
   two jaws, each of the two jaws being respectively fixed to the two gripper fingers, and the two jaws being respectively drivable by the two gripper fingers to slide toward or away from each other in the degree of freedom so as to grab the at least one second assembly member.

14. The robot positioning system of claim 13, wherein each of the two jaws includes:
   a second limiting structure, an end face of the second limiting structure being configured to abut the at least one grabbed second assembly member to limit the at least one second assembly member, the end face of the second limiting structure being perpendicular to an assembly direction of the at least one second assembly member.

15. The robot positioning system of claim 1, wherein the movable part is configured to separate the first assembly member from the conveying mechanism such that a vibration of the conveying mechanism does not affect the first assembly member.

* * * * *